GAIN CONTROL CIRCUITS

Filed Aug. 26, 1958

INVENTOR
JOHN D. HARMER
BY H. Vincent Harsha
ATTORNEY

United States Patent Office 3,036,275

Patented May 22, 1962

3,036,275

GAIN CONTROL CIRCUITS

John D. Harmer, Cambridge, Mass., assignor to Raytheon Company, a corporation of Delaware Filed Aug. 26, 1958, Ser. No. 757,399

7 Claims. (Cl. 330—29)

Figure 1:
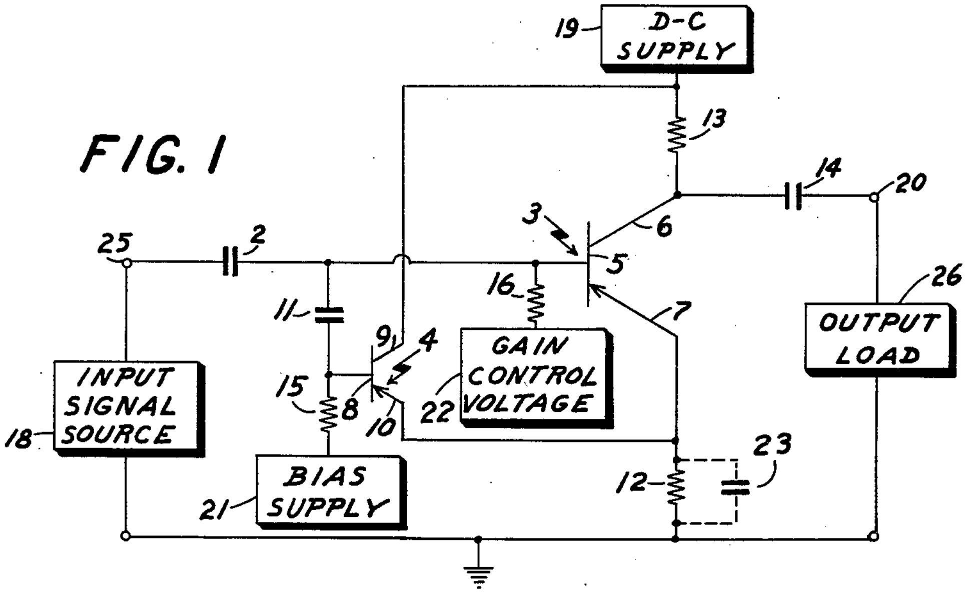

This invention pertains generally to gain control circuits and, more particularly, to gain control circuits utilizing semi-conductor devices, such as transistors.

Conventional gain control circuits which utilize semiconductor devices, such as transistors, generally make use of the well-known phenomena that the input impedance of such devices varies with the bias conditions applied. Prior to this invention, it has been conventional to apply the input voltage to a transistor amplifier across a fixed resistance R. The current gain is then proportional to the quantity $$\frac{R}{R+Z_{in}}$$

where $Z_{in}$ represents the input impedance of the transistor. It can be seen from this expresion that the gain decreases when the input impedance increases and the gain increases when the input impedance decreases. If the input impedance varies, then, as a function of bias, a change in bias can be used to vary the gain. The range of variation of gain is limited by the range of variation of $Z_{in}$; and, for values normally encountered in circuits prior to this invention, the gain varies over a maximum ratio of 10 to 1. Whether or not this maximum ratio is attained depends on the value selected for the fixed resistance R.

It is desirable in many applications, however, to provide for a variation in gain over a range that is much larger than the 10 to 1 ratio achieved by circuits in general use prior to this invention. This invention provides gains on the order of 100 to 1, which allows the invention to be used in a great many more applications than the prior art circuits. The invention also makes use of the well-known property of transistors that their input impedance varies with bias conditions. However, in this invention, the fixed resistance shunting the input of the transistor amplifier is replaced with a second transistor. This second transistor then provides a variable impedance in place of the fixed impedance R of the previous circuits. The circuit of the invention is so arranged that the bias supply on one of the transistors is varied in accordance with a predetermined gain control voltage and the bias supply on the other transistor is fixed. As the input impedance of one transistor changes in one direction due to a change in bias conditions, the input impedance of the other transistor changes in the opposite direction. Because the gain is depedent upon the variation of both input impedances, the range of gain variation is increased to a ratio on the order of 100 to 1.

Another advantage which arises due to the invention is that the overall input impedance remains constant, despite the change in input impedance of the individual transistors. In addition, the total current drain also remains constant over the entire range of variation. A gain control voltage is required only at a single point in the circuit and may be applied to the bias circuit of either of the transistors with the bias supply of the other transistor remaining fixed. Because the transistors are compatible in that they have essentially the same characteristics, the distortion that may be normally present in conventional gain control transistor circuits is considerably reduced. These and other advantages of this invention will become apparent in the more detailed description of the invention which follows.

Figure 2:
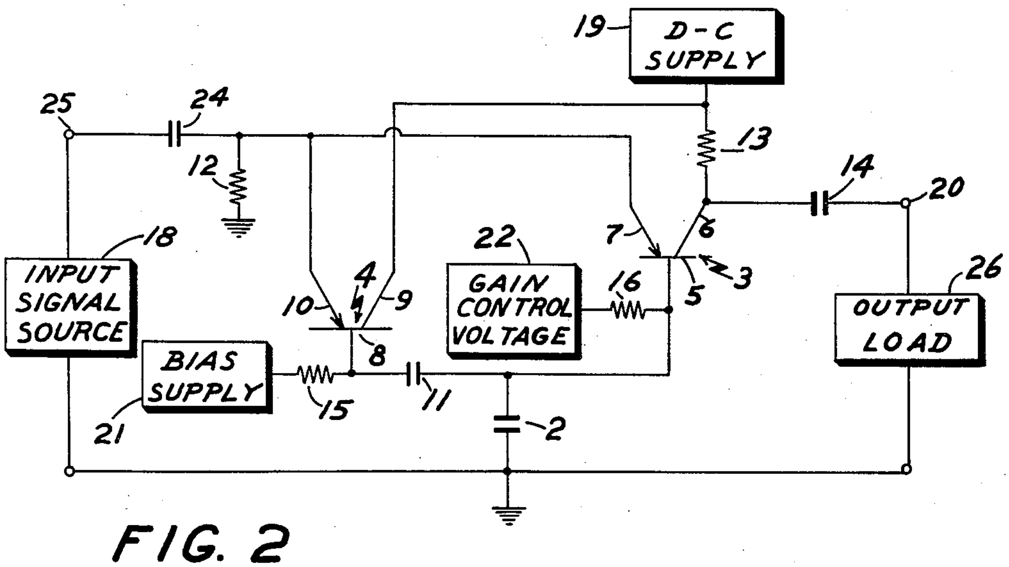

The configuration and operation of the invention may be more easily understood with the help of the drawing in which:

FIG. 1 shows a circuit diagram that represents a particular embodiment of the invention utilizing a pair of transistors with grounded emitter circuits, said transistors having parallel connected inputs; and FIG. 2 shows a circuit diagram that represents another embodiment of the invention utilizing a pair of transistors with grounded base circuits, said transistors having parallel connected inputs.

In FIG. 1 there is shown an amplifying transistor 3 having a base electrode 5, a collector electrode 6 and an emitter electrode 7. One end of an input signal source 18 is connected to an input terminal 25. The other end of signal source 18 is connected to ground. The input signal is applied to base electrode 5 of transistor 3 through a coupling condenser 2. Collector electrode 6 is connected to a source 19 of D.-C. supply voltage through a resistor 13. Emitter electrode 7 is connected to ground through a resistance 12. A second transistor 4 is connected substantially in parallel with transistor 3 through a blocking condenser 11, one end of which is connected to base electrode 5 of transistor 3 and the other end of which is connected to base electrode 8 of transistor 4. Collector electrode 9 of transistor 4 is connected directly to D.-C. supply source 19. Emitter electrode 10 of transistor 4 is connected to emitter electrode 7 of transistor 3. If additional voltage amplification is required and a lower impedance is not objectionable, a by-pass condenser 23 may be connected across emitter resistor 12 as shown by the dashed lines. One side of a condenser 14 is connected to collector electrode 6 of transistor 3. The other side of condenser 14 is connected to output terminal 20, thereby providing an output signal from terminal 20 to ground. An output load 26 is connected from terminal 20 to ground. A fixed resistor 15 is connected between base electrode 8 of transistor 4 and a fixed source of bias supply voltage 21. A fixed resistor 16 is connected between base electrode 5 of transistor 3 and a source 22 which supplies a variable gain control voltage. The gain control voltage may be supplied from another circuit when the invention is used in a conventional automatic gain control system or it may be supplied from some separate source for providing a controlled gain through transistor amplifier 3 for any purpose whatsoever that may be desired.

A change in gain control voltage causes a change in emitter bias current such that if the emitter bias current increases in transistor 4, that in transistor 3 decreases. These changes in bias current in the two transistors result in a decrease in the input impedance of transistor 4 and an increase in the input impedance of transistor 3. The portion of the input signal current which passes through transistor 3 is thereby reduced. If the values of bias current change in the opposite directions, the portion of the input signal current which passes through transistor 3 is increased and, thus, a relatively wide range of variation in gain may be produced. Because the input impedances vary inversely, the overall input impedance remains constant. The effects of a temperature change upon the operating point of each transistor tend to cancel each other out because the transistors have substantially the same characteristics. The variable gain control voltage supply can be applied to the base electrode of transistor 3 and the fixed bias applied to transistor 4 as shown in the figure, or these bias supplies can be interchanged, with the variable bias supplied to transistor 4 and the fixed bias supplied to transistor 3. The common emitter path to ground through resistance 12 is utilized to ensure balanced bias currents in transistors.

Although the invention shown in FIG. 1 utilizes a grounded emitter circuit, there is nothing to prevent the use of the invention with grounded base or grounded collector transistors. A grounded base circuit is shown in FIG. 2. In this figure the input voltage from source 18 is applied through condenser 24, as shown in the circuit, to emitter electrodes 7 and 10 across emitter resistance 12. In the grounded base circuit of FIG. 2, condenser 2 (which in the grounded emitter circuit is connected to the input terminal) is now connected to ground. Otherwise the circuit of FIG. 2 is substantially the same as that in FIG. 1 and the operation as described in conjunction with FIG. 1 can be applied to the circuit of FIG. 2.

This invention is not limited to the particular details of construction, materials and processes described, as many equivalents will suggest themselves to those skilled in the art. It is accordingly desired that the appended claims be given a broad interpretation commensurate with the scope of the invention within the art.

What is claimed is:

1. A gain control circuit including, in combination, a source of input signals; a variable bias means; a first transistor for amplifying said input signal having a first base electrode, a first collector electrode, and a first emitter electrode, said base electrode connected to said input source and to said variable bias means, said first transistor having an input impedance that varies in accordance with the bias applied to said first transistor; a fixed bias means; a second transistor having a second base electrode, a second collector electrode, and a second emitter electrode, said second base electrode being connected to said input source and to said fixed bias means, said second transistor having an input impedance that varies in accordance with the bias applied to said second transistor; said first and said second emitter electrodes connected through conductive paths to a common point; means connected between said common point and a reference point for maintaining a substantially constant current for said first and second transistors; and means for varying said variable bias means in a predetermined manner whereby the input impedance of said first transistor and the input impedance of said second transistor vary inversely relative to each other and the gain provided by said first transistor is controlled in a predetermined manner.

2. A gain control circuit including, in combination, a source of input signals; a variable bias means; a first transistor for amplifying said input signals having a first base electrode, a first collector electrode, and a first emitter electrode, said emitter electrode being connected to said source of input signals, said first transistor having an input impedance that varies in accordance with the bias applied to said first transistor, said first base electrode being connected to said variable bias means; a fixed bias means; a second transistor having a second base electrode, a second collector electrode, and a second emitter electrode, said second base electrode being connected to said fixed bias means, said second emitter electrode being connected to said input source, said second transistor having an input impedance that varies in accordance with the bias applied to said second transistor, said first and said second emitter electrodes being connected through conductive paths to a common point; means connected between said common point and a reference point for maintaining a substantially constant current for said first and second transistors; and means for varying said variable bias means in a predetermined manner whereby the input impedance of said first transistor and the input impedance of said second transistor vary inversely relative to each other and the gain provided by said first transistor is controlled in a predetermined manner.

3. A gain control circuit including, in combination, a source of input signals; amplifying means being connected to said input source and having at least a first pair of electrodes, said first pair of electrodes having the characteristics that a varying bias applied to one of them causes a predetermined change in the impedance across them; shunting means being connected to said input signal source and having at least a second pair of electrodes, said second pair of electrodes having substantially similar characteristics as said first pair of electrodes, one of said first pair of electrodes having the same polarity relative to the other of said first pair of electrodes as one of said second pair of electrodes has relative to the other of said second pair of electrodes; first bias means connected to said one of said first pair of electrodes; second bias means connected to said one of said second pair of electrodes; said other of said first pair of electrodes and said other of said second pair of electrodes being connected through conductive paths to a common point; and means connected between said common point and a reference point for maintaining a substantially constant current for said amplifying and shunting means, means for controlling at least one of said bias means whereby the input impedance of said amplifying means and the input impedance of said shunting means vary inversely relative to each other and the gain of said amplifying means is controlled.

4. A gain control circuit including, in combination, a source of input signals; semiconductor means being connected to said input source and having at least a first pair of electrodes, said first pair of electrodes having the characteristics that a varying bias applied to one of them causes a predetermined change in the impedance across them; shunting means being connected to said input signal source and having at least a second pair of electrodes, said second pair of electrodes having substantially similar characteristics as said first pair of electrodes, one of said first pair of electrodes having the same polarity relative to the other of said first pair of electrodes as one of said second pair of electrodes has relative to the other of said second pair of electrodes; first bias means connected to said one of said first pair of electrodes; second bias means connected to said one of said second pair of electrodes; said other of said first pair of electrodes and said other of said second pair of electrodes being connected through conductive paths to a common point; and means connected between said common point and a reference point for maintaining a substantially constant current for said semiconductor and shunting means, means for controlling at least one of said bias means whereby the input impedance of said semiconductor means and the input impedance of said shunting means vary inversely relative to each other and the gain of said semiconductor means is controlled.

5. A gain control circuit including, in combination, a source of input signals; a first semiconductor device being connected to said input source and having at least a first pair of electrodes, said first pair of electrodes having the characteristics that a varying bias applied to one of them causes a predetermined change in the impedance across them; a second semiconductor device being connected to said input signal source and having at least a second pair of electrodes, said second pair of electrodes having substantially similar characteristics as said first pair of electrodes, one of said first pair of electrodes having the same polarity relative to the other of said first pair of electrodes as one of said second pair of electrodes has relative to the other of said second pair of electrodes; first bias means connected to said one of said first pair of electrodes; second bias means connected to said one of said second pair of electrodes; said other of said first pair of electrodes and said other of said second pair of electrodes being connected through conductive paths to common point; means connected between said common point and a reference point for maintaining a substantially constant current for said first semiconductor device and second semiconductor device, and means for controlling at least one of said bias means whereby the input impedance of said first semiconductor device and the input impedance of said second semiconductor device vary inversely relative to each other and the gain of said first semiconductor device is controlled.

6. A gain control circuit including, in combination, a source of input signals; a first transistor being connected to said input source and having at least a first pair of electrodes, said first pair of electrodes having the characteristics that a varying bias applied to one of them causes a predetermined change in the impedance across them; a second transistor being connected to said input signal source and having at least a second pair of electrodes, said second pair of electrodes having substantially similar characteristics as said first pair of electrodes, one of said first pair of electrodes having the same polarity relative to the other of said first pair of electrodes as one of said second pair of electrodes has relative to the other of said second pair of electrodes; first bias means connected to said one of said first pair of electrodes; second bias means connected to said one of said second pair of electrodes; said other of said first pair of electrodes and said other of said second pair of electrodes being connected through conductive paths to a common point; means connected between said common point and a reference point for maintaining a substantially constant current for said first transistor and second transistor, and means for controlling at least one of said bias means whereby the input impedance of said first transistor and the input impedance of said second transistor vary inversely relative to each other and the gain of said first transistor is controlled.

7. A gain control circuit including, in combination, a source of input signals; a first transistor being connected to said input source and having at least a first pair of electrodes, said first pair of electrodes having the characteristics that a varying bias applied to one of them causes a predetermined change in the impedance across them; a second transistor being connected to said input signal source and having at least a second pair of electrodes, said second pair of electrodes having substantially similar characteristics as said first pair of electrodes, one of said first pair of electrodes having the same polarity relative to the other of said first pair of electrodes as one of said second pair of electrodes has relative to the other of said second pair of electrodes; variable bias means connected to said one of said first pair of electrodes; fixed bias means connected to said one of said second pair of electrodes; said other of said first pair of electrodes and said other of said second pair of electrodes being connected through conductive paths to a common point; means connected between said common point and a reference point for maintaining a substantially constant current for said first transistor and second transistor, and means for varying said variable bias means whereby the input impedance of said first transistor and the input impedance of said second transistor vary inversely relative to each other and the gain of said first transistor is controlled.

References Cited in the file of this patent

UNITED STATES PATENTS

| | | |
|---|---|---|
| 2,761,917 | Aronson | Sept. 4, 1956 |
| 2,774,866 | Burger | Dec. 18, 1956 |
| 2,802,067 | Zawels | Aug. 6, 1957 |
| 2,808,471 | Poucel | Oct. 1, 1957 |
| 2,816,964 | Giacoletto | Dec. 17, 1957 |
| 2,841,702 | Barton | July 1, 1958 |
| 2,871,305 | Hurtig | Jan. 27, 1959 |